(12) United States Patent
Pinai

(10) Patent No.: US 6,424,208 B1
(45) Date of Patent: Jul. 23, 2002

(54) SWITCHED CAPACITOR FILTER WITH INTEGRATED VOLTAGE MULTIPLIER

(75) Inventor: Hoang Minh Pinai, San Jose, CA (US)

(73) Assignee: The Engineering Consortium, Inc., Santa Clara, CA (US)

( * ) Notice: Subject to any disclaimer, the term of this patent is extended or adjusted under 35 U.S.C. 154(b) by 0 days.

(21) Appl. No.: 09/474,850

(22) Filed: Dec. 30, 1999

(51) Int. Cl.[7] .................................................. H03K 5/00
(52) U.S. Cl. ............................ 327/554; 327/589; 330/9
(58) Field of Search .............................. 327/589, 554, 327/259, 122, 119, 543, 536; 330/9

(56) References Cited

U.S. PATENT DOCUMENTS

| | | | |
|---|---|---|---|
| 4,716,319 A | 12/1987 | Rebeschini | 307/520 |
| 4,883,976 A * | 11/1989 | Deane | 327/536 |
| 4,982,317 A | 1/1991 | Mauthe | 363/60 |
| 5,357,217 A * | 10/1994 | Marchesi et al. | 327/259 |
| 5,592,120 A * | 1/1997 | Palmer et al. | 327/536 |
| 5,640,111 A | 6/1997 | Hasegawa | 327/122 |
| 5,745,002 A | 4/1998 | Baschirotto et al. | 327/554 |

* cited by examiner

Primary Examiner—Dinh T. Le
(74) Attorney, Agent, or Firm—Coudert Brothers LLP

(57) ABSTRACT

An integrated transient voltage pulse multiplier is used to increase the voltage to the gates of control switches in a low voltage circuit. The increased conductance of the control switches permits a reduction in gate width, reducing parasitic charge injection and capacitive feedthrough. A low distortion switched capacitor filter utilizes two transient voltage pulse multipliers to increase the voltage of non-overlapping clock signals. The switched capacitor filter is operative at a power supply voltage of less than 1.5 volts.

1 Claim, 7 Drawing Sheets

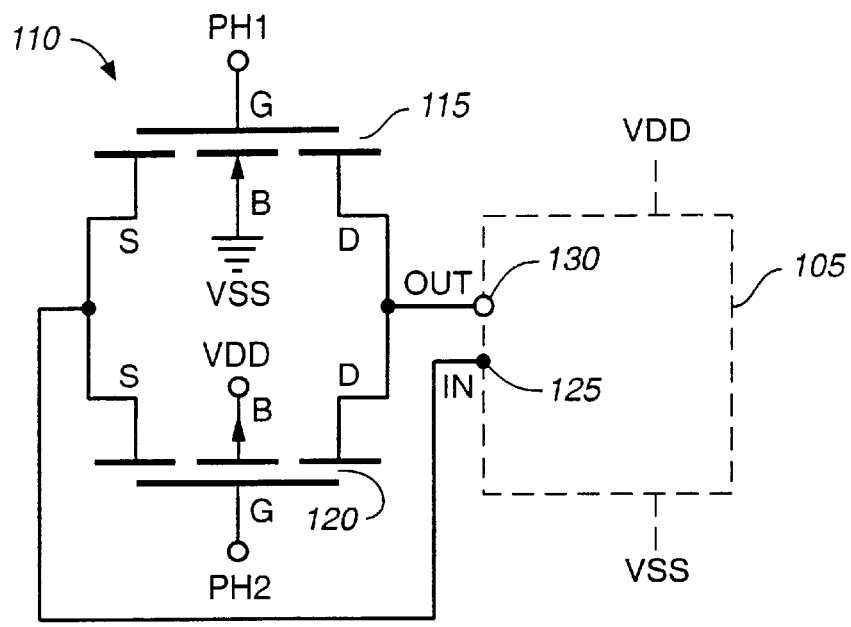
FIG._1A
(PRIOR ART)
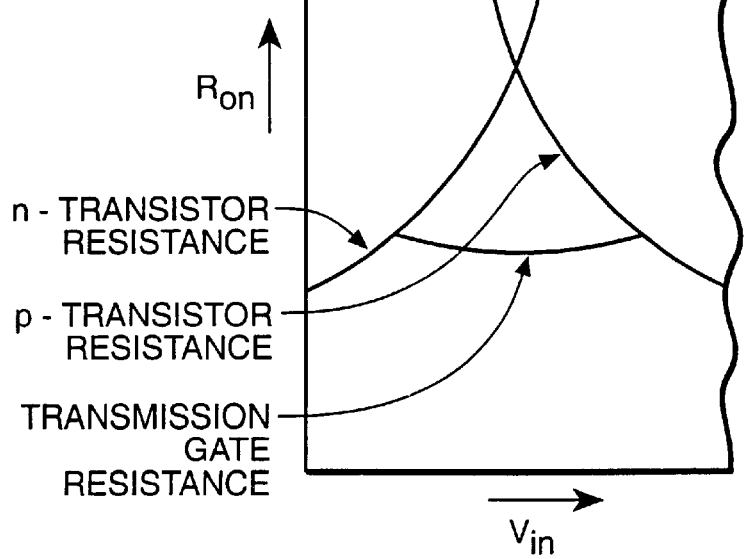
FIG._1B
(PRIOR ART)

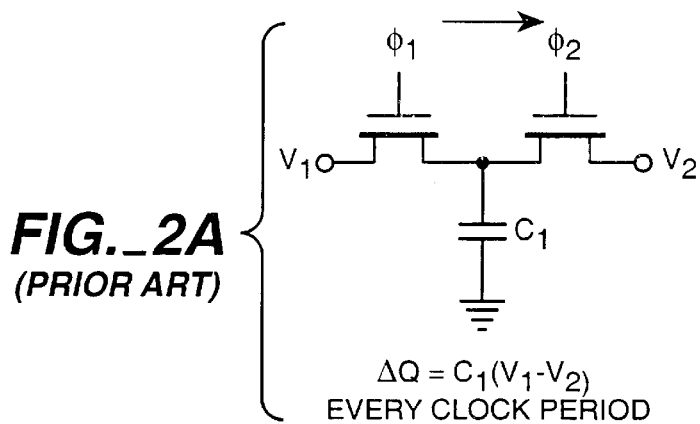
FIG._2A
(PRIOR ART)
FIG._2B
(PRIOR ART)
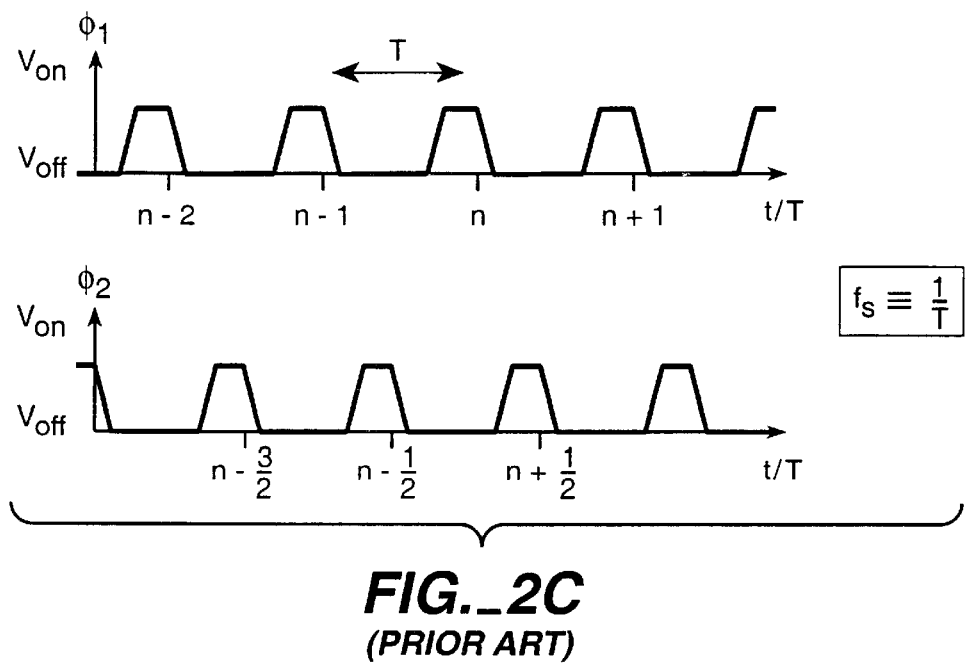
FIG._2C
(PRIOR ART)
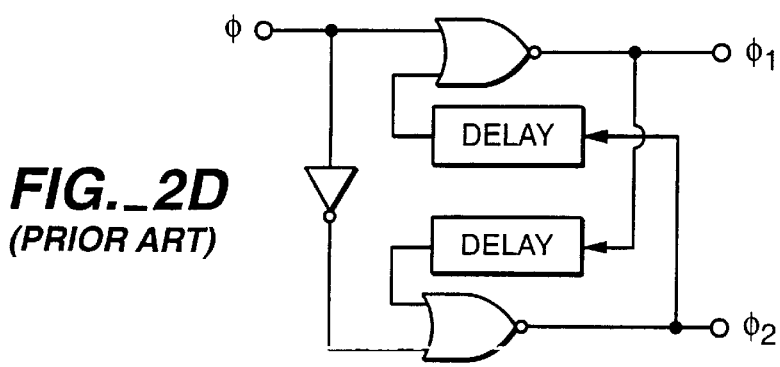
FIG._2D
(PRIOR ART)

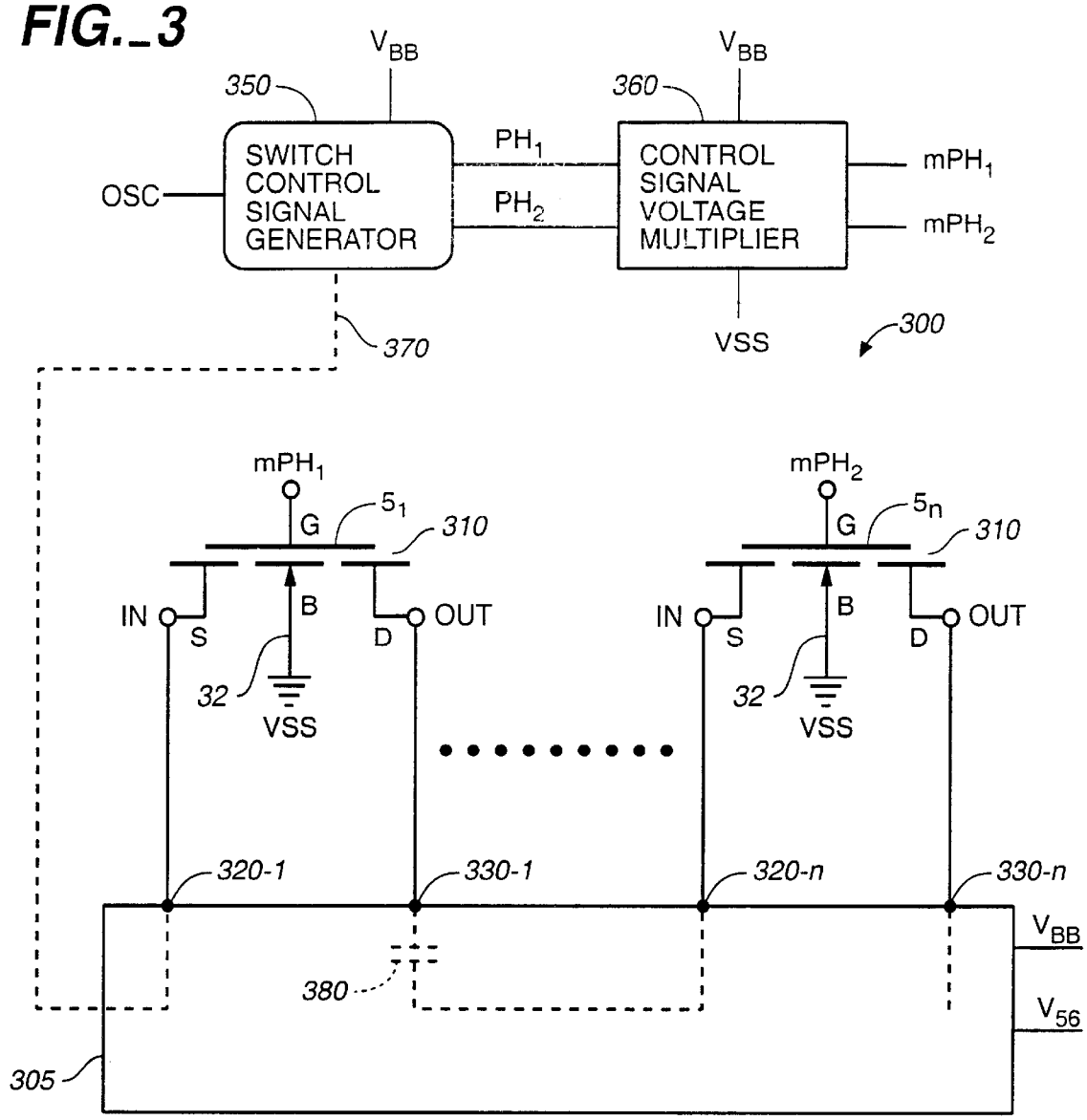
FIG._3
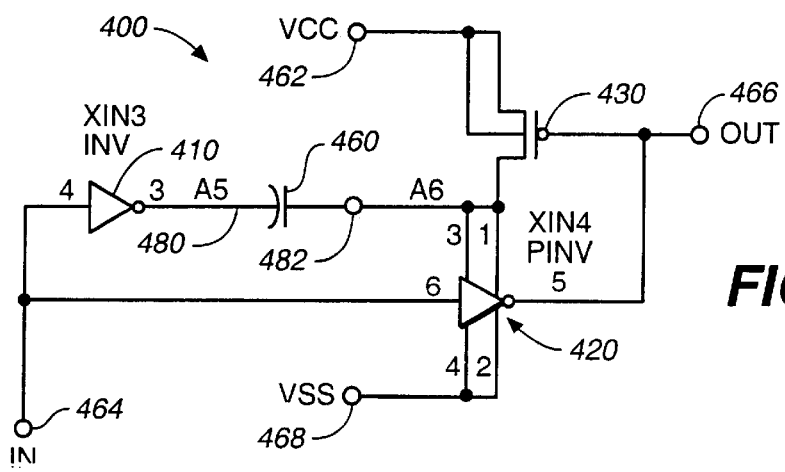
FIG._4

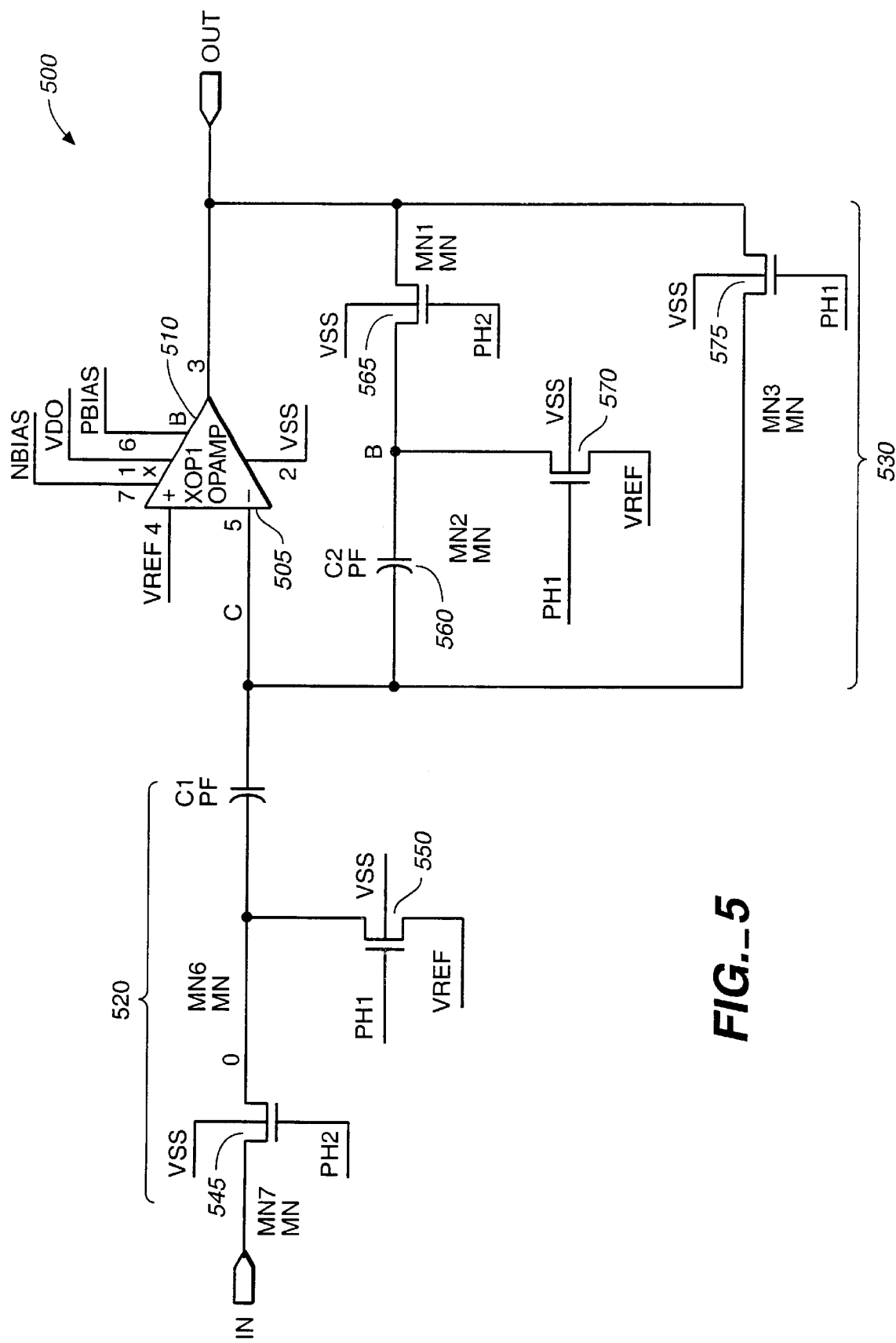
FIG._5

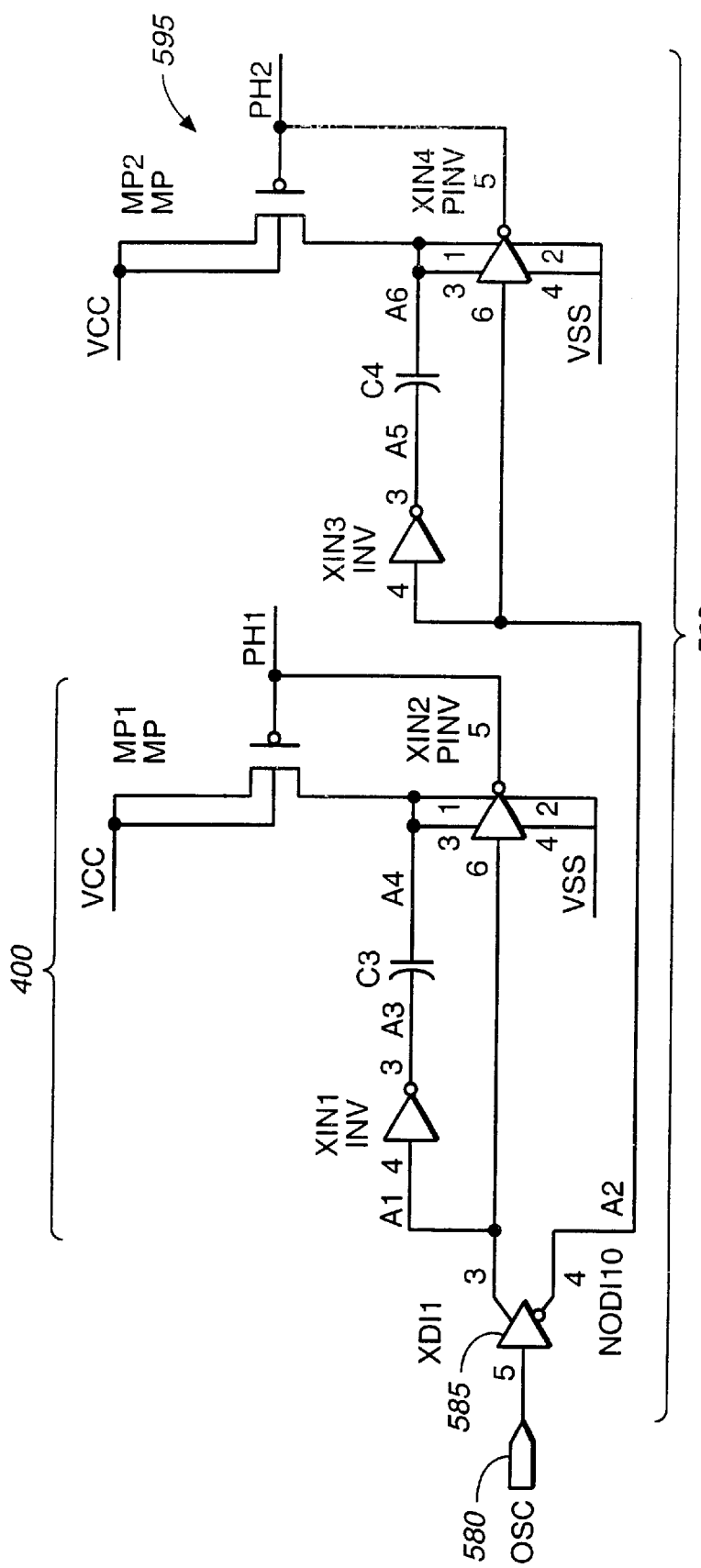
FIG._6

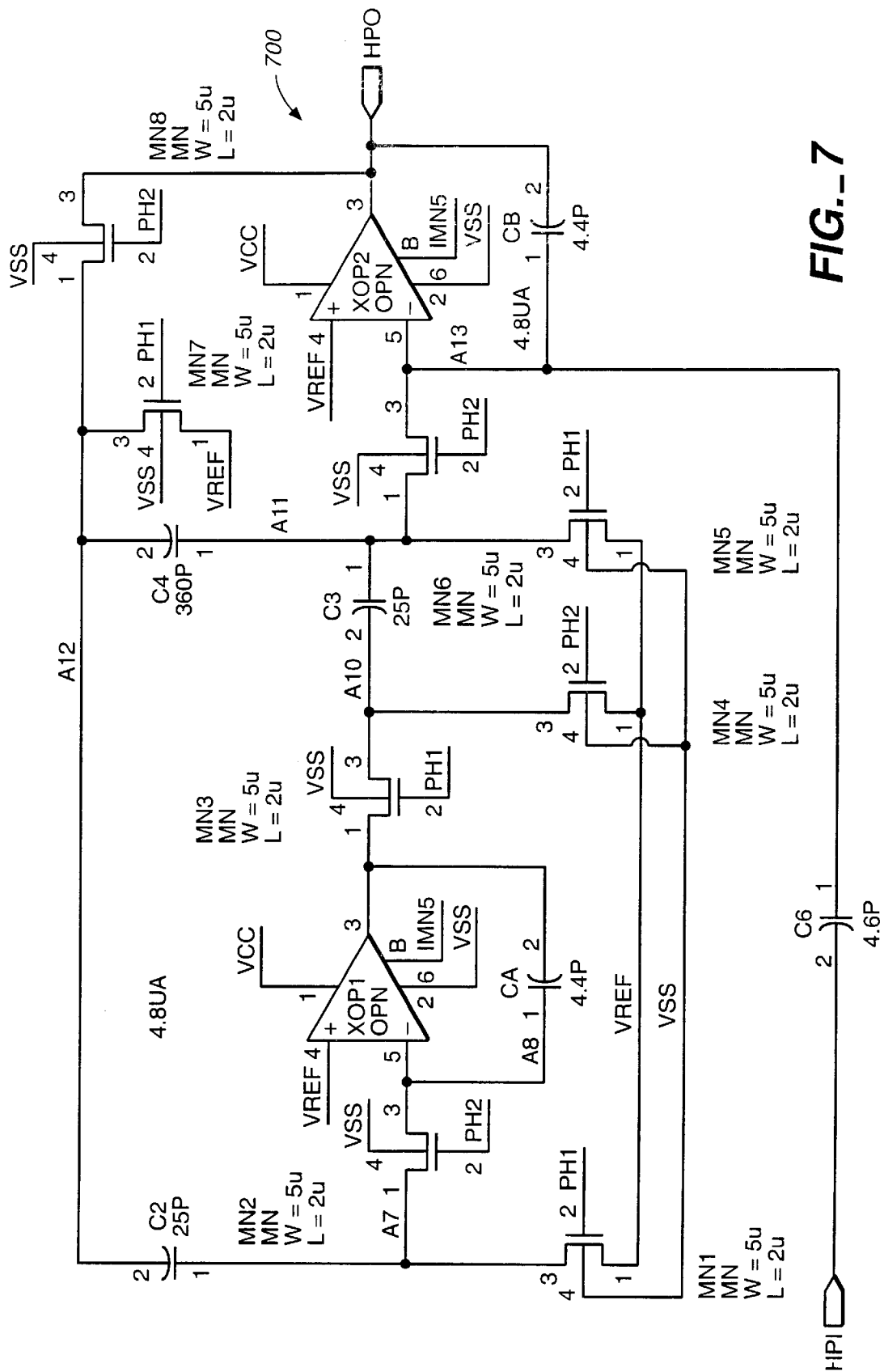
FIG._7

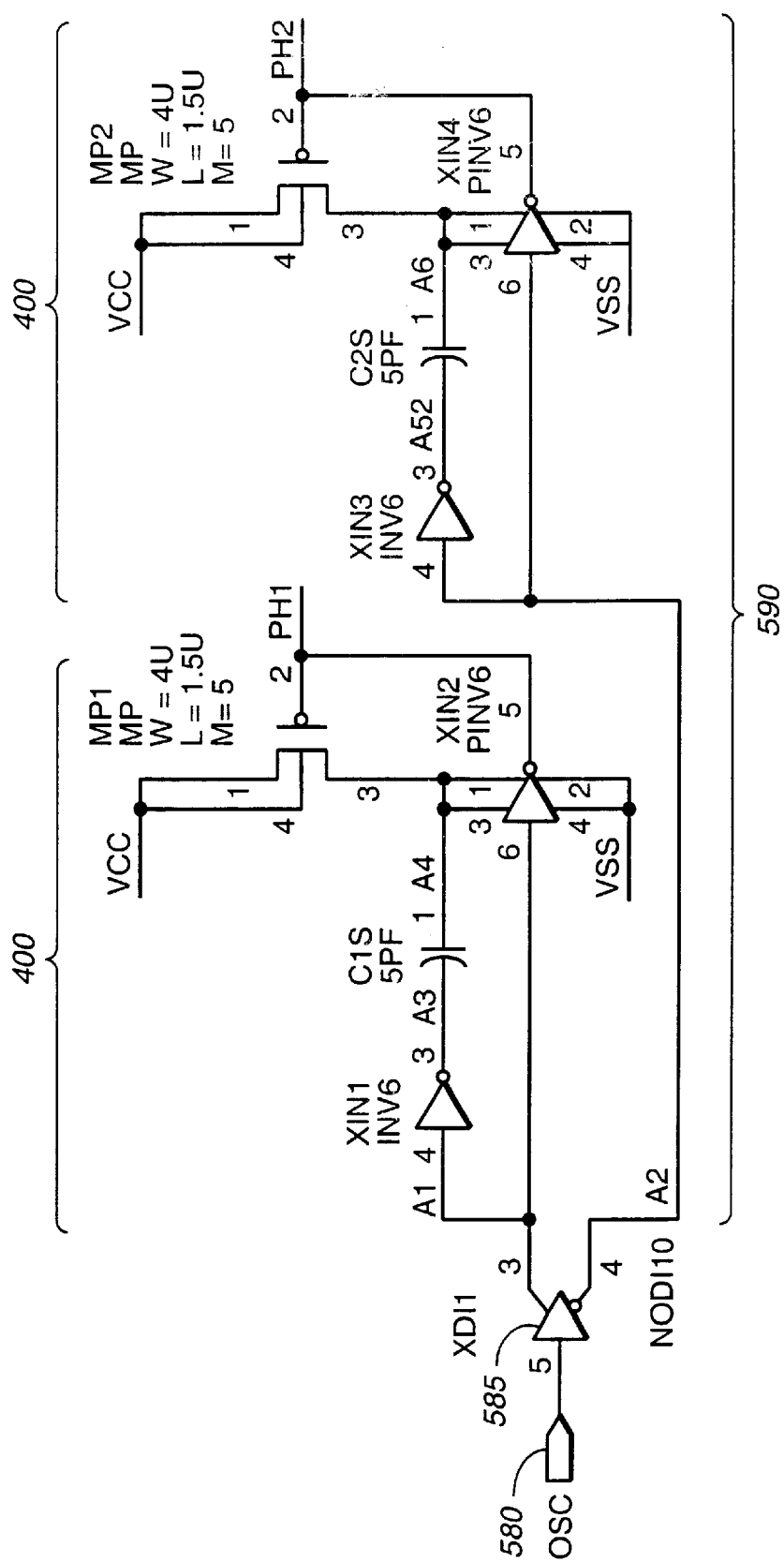
FIG._8

SWITCHED CAPACITOR FILTER WITH INTEGRATED VOLTAGE MULTIPLIER

FIELD OF THE INVENTION

The present invention relates generally to low voltage op-amp circuits that utilize one or more metal oxide semiconductor field effect (MOSFET) shunt switches to couple key circuit nodes together. More particularly, the present invention relates to the design of low voltage operational amplifier circuits with switched capacitor elements.

BACKGROUND OF THE INVENTION

A variety of desirable complimentary metal oxide semiconductor (CMOS) operational amplifier ("op-amp") circuits are well-known in the field of analog and digital circuit design. These include a variety of CMOS op-amp circuits with switching elements composed of metal oxide semiconductor field effect transistors (MOSFETs). There are many applications where the switching elements are operated in either an "on" or "off" mode to regulate or control other circuit elements. In addition to digital circuit applications, a variety of op-amp circuits incorporate a plurality of switching elements. In the context of operational amplifier circuits, MOSFET switches are used, for example, to couple other impedance elements (e.g., capacitors) to input or feedback paths of an op-amp. MOSFET switches are also used to perform a reset function in op-amp circuits.

At typically power supply voltages of three-to-five volts, MOSFET switches can be modeled as having a sufficiently low enough on-resistance that their non-ideality can be ignored in analyzing the operation of many circuits. An ideal switch has a infinite conductance (zero resistance) in its on-state and zero conductance (infinite resistance) in its off-state. At conventional power supply voltages MOSFET switching elements are often modeled as performing a shunt-switch function because the MOSFET switch has a resistive impedance that is sufficiently small that a negligible voltage drop occurs across the switch.

The design of CMOS op-amp circuits that operate at a low power supply voltage presents special design problems. Low voltage CMOS circuit design is generally considered to include CMOS circuits operating at a supply voltage below about three volts, corresponding to the power supply voltage of current high performance microprocessors. Some consumer electronic devices currently operate at even lower power supply voltages. Miniature hearing aids, in particular, typically have a power supply comprising a single miniature battery with a nominal voltage of about 1.5 volts, corresponding to the voltage of a single miniature electrolytic cell. Although hearing aids are one of the most common CMOS circuits presently designed to be powered by a 1.5 volt power supply, a variety of other compact electronic devices may ultimately be reduced to a size where they will be powered by a single miniature battery.

Referring to FIG. 1A, a general problem in low voltage circuit design is that of a circuit element 105 (shown in phantom) requiring a shunt switch 110 comprised of one or more MOSFET transistors, such as an n-channel MOSFET transistor 115 and a p-type MOSFET transistor 120 forming a transmission gate shunt switch 110. An ideal switch has an infinite conductance (zero-resistance) in its on-state and an infinite resistance (zero conductance) in its off state. However, in low voltage circuit design the switch 110 typically has a significant resistance in its on-state. Additionally, in its "off" state, the low voltage switch 110 may also act as a parasitic current/voltage source, altering the voltage at circuit nodes 125, 130 coupled to the shunt switch. In many low-voltage op-amp circuit applications, the non-ideal characteristics of shunt switch 110 degrades the performance of circuit elements 105 coupled to shunt switch 110.

It is difficult at a low power supply voltage to operate a MOSFET switch with both a low on-resistance and acceptable turn off-behavior (e.g., low parasitic turn-off charge injection). CMOS switches, when driven with 3.0 V to 5.0 V gate drive signals, may be readily operated in a so-called "ohmic" region in which the transistors of the switches have a low on-resistance. The ohmic region of an n-channel MOSFET is typically defined as occurring at a voltage for which the gate-source voltage, $V_{GS}$, of the MOSFET is greater than the drain-source voltage, $V_{DS}$, plus a threshold voltage, $V_{TN}$, or $V_{GS} > V_{DS} + V_{TN}$. In the ohmic region, the source-drain current, $I_{DS}$, is proportional to the square of the gate-source voltage minus the threshold voltage, or $I_{DS} = k(V_{GS} - V_{TN})^2$, where k is a constant. For a gate-source voltage above the threshold voltage but below the ohmic region, an n-channel MOSFET operates in a so-called linear or triode region where the drain source voltage increases linearly with drain source voltage, which is expressed mathematically as: $I_{DS} = 2k[(V_{GS} - V_{TN}) V_{DS} - 0.5 V_{DS}^2]$. The on-resistance, $R_{DS}$, is very high in the linear region, and is given by the expression: $R_{DS} = \frac{1}{2}k[(V_{GS} - V_{TN}) - 0.5 V_{DS}]$, where k is a constant proportional to the width of the transistor.

A p-channel MOSFET has a similar triode and ohmic behavior but with reference to different voltage polarities. A p-channel MOSFET enters the triode region when the source-gate voltage $V_{SG}$ is greater than a (positive) threshold value, $V_{TP}$ and the source-drain voltage, $V_{SD}$ is less than the source-gate voltage minus the threshold value, which is expressed as: $V_{SD} < V_{SG} - V_{TP}$. The corresponding p-channel drain current is: $I_{SD} = 2k[(V_{SG} - V_{TP}) V_{SD} - 0.5 V_{SD}^2]$ and the corresponding on-resistance is: $R_{SD} = \frac{1}{2}k[(V_{SG} - V_{TP}) - 0.5 V_{SD}]$.

FIG. 1B shows the on-resistance of shunt switch 110 as function of input signal level for a constant supply voltage. The resistance of n-channel MOSFET 115 and p-channel MOSFET 120 is shown along with the parallel resistance of switch 110 as a whole. FIG. 1B is for one selection of drain-source voltage. More generally, a family of curves must be drawn for the on-resistance as function of both source-drain voltage and gate-source voltage (PH1 and PH2 in FIG. 1A). For source-drain and gate voltages corresponding to an on-state in the triode region of an individual MOSFET 115, 120, the conductance per unit of gate width is low. Consequently, the gate width of each MOSFET transistor may have to be hundreds of microns wide to have a reasonable on-resistance of switch 110. However, increasing the gate width is not a viable solution in many low voltage circuit designs. One problem is that large area shunt switches 110 increase the size, and hence the cost, of a circuit. Another problem is that increasing the gate width of MOSFET switches 115, 120 increases the non-ideality of switch 110 in regards to its turn-off behavior.

Parasitic charge injection and capacitive feedthrough are the two main deleterious effects which occur in wide gate width MOSFETs at turn off. Since both parasitic charge injection and capacitive feedthrough increase with gate width, increasing the gate width of a MOSFET switch to reduce its on-resistance results in the tradeoff that parasitic charge injection and capacitive feedthrough increase in the off-state.

Parasitic charge injection is, as its name implies, the undesired injection of charge from a MOSFET as it is turned-off. When MOSFET transistors are turned off, channel charge must flow out from the channel region of the transistor to the drain and source junctions. This causes parasitic charge injection every time the switch 110 is turned off. The total channel charge in a n-channel MOSFET increases with gate width and is typically expressed mathematically as: $Q_{CH}=WLC_{OX}(V_{GS}-V_{TN})$, where $Q_{CH}$, is the channel charge, W is the gate width, L is the gate length, and $C_{OX}$ is the oxide capacitance. A similar expression also describes to describe the total charge in an p-channel MOSFET but with different polarity of charge, p-type threshold voltage, and source-gate voltage. In a complementary pair switch configuration, such as that of shunt switch 110, the parasitic charge injection of the n-channel transistor tends to act to cancel the parasitic charge injection of the p-channel transistor. However, it is difficult, particularly at a low drain-source voltage, to precisely match the characteristics of the n-channel transistor 115 and p-channel transistor 120 to achieve low net parasitic charge injection. Capacitive feedthrough, as its name implies, is associated with the a capacitive voltage coupling effect caused by the gate-drain capacitance of a MOSFET. The effect of capacitive feedthrough is to form a capacitive voltage divider between the gate-drain (source) capacitance and the load capacitance. When the switch 110 is turned off (low gate voltage) a portion of the gate-signal appears across the load. Since gate-drain capacitance increase with gate width, MOSFETs with a wide gate width have increased capacitive feedthrough.

One important class of circuits for which the non-ideality of MOSFET switches hinders the implementation of low-voltage circuits is switched capacitor op-amp circuits. Generally speaking, in a switched capacitor op-amp circuit two or more branches of the op-amp circuit incorporate a quasi-resistive element comprising a combination of capacitors and switches. FIG. 2(a) shows a prior art switched capacitor circuit element used in a variety of switched capacitor op-amp circuits. Each time the switch(es) open and close there is a change in charge, $\Delta Q$, associated with a voltage differential, $\Delta V$, across each capacitor with a capacitance, C, of: $\Delta Q=C\Delta V$. If the switch is substantially ideal, its impedance can be ignored so that the time average current passing through the switched capacitor is: $I=C(V_1-V_2)/T$, where $(V_1-V_2)$ is the voltage across the capacitor and the switch and T is the clock period. As shown in FIG. 2(b), for the case of a single capacitor in series with a single ideal switch, the equivalent resistance is $R_{eq}=1/Cf_s$, where $f_s$ is the switching frequency and C is the capacitance. As indicated in FIG. 2(a) typically two switches are used to control the injection of charge into and out of the switched capacitor. Typically, the two switches are driven by so-called non-overlapping clock signals, as indicated in FIG. 2(c), since this provides superior control over the charge entering and leaving the capacitor. The non-overlapping clock signals may be generated by a variety of means, such as by the modified data flip-flop of FIG. 2(d) that utilizes delay elements to convert an input oscillator signal into two output signals that are complementary and non-overlapping.

A switched capacitor op-amp circuit offers several potential benefits. One benefit is that the equivalent resistance of the branches of a switched capacitor circuit can, in principle, be accurately controlled by selection of the value of the capacitance of the capacitors and the switching frequency. Another potential benefit of a switched capacitor op-amp circuit is that a compact switched capacitor element eliminates the need for large value discrete resistors. For example, an op-amp feedback amplifier design requiring resistive elements with an impedance on the order of several MegaOhms can not readily be implemented with conventional integrated circuit resistors. However, switched capacitor elements can be used to emulate the function of large-value resistors which would otherwise require discrete resistors, thus reducing the cost and size of the op-amp feedback amplifier.

Unfortunately, many of the potential benefits of switched capacitor circuits cannot be realized at a low power supply voltage because of the non-ideality of the switching transistors. A high on-resistance of the switches may compromise the performance of the switched capacitor circuit in a variety of ways. A high on resistance (e.g., an on-resistance greater than about 1% of the desired equivalent resistance) deleteriously affects the ability to accurately control the equivalent resistance of the switched capacitor circuit. Additionally, the settling time of the circuit, i.e., the time required by the circuit to reach a quasi-steady state in response to a sudden change in inputs is a further consideration. If the on-resistance it too high, the RC time constant may be a significant fraction of the on-time (i.e., greater than 10% of the on-time) so that the switched capacitor does not fully charge/discharge during each switching period. On the other hand, if the transistor switches are made wide (e.g. one-hundred microns) to reduce the on-resistance, parasitic charge injection and capacitive feedthrough increase. It is well known in the art of CMOS design that parasitic charge injection and capacitive feedthrough alter the potential at key switched capacitor circuit nodes in a variety of undesirable ways. In switched capacitor filters, for example, parasitic charge injection results in distortion of an analog signal. In the context of miniature low-voltage hearing aids, the aforementioned problems make it impractical with conventional techniques to incorporate a high performance switched capacitor op-amp filter with acceptable sound quality into a hearing aid.

The non-ideality of MOSFET switches at low power supply voltages hinders the implementation of a variety of low-noise op-amp circuits that are compact and consistent with the power supply parameters of a miniature hearing aid battery (e.g., a battery voltage of about 1.5 volts and a low total current consumption). Although switched capacitor op-amp filter circuits for use in hearing aids are one important class of circuits, a variety of other low-voltage circuits may be deleteriously affected by the same problem of the non-ideality of MOSFET shunt switches operated at a low power supply voltage. This includes a variety of low-voltage audio amplifier circuits incorporated into cellular phones, miniature recorders, and other devices incorporating audio devices.

What is desired is a new design approach for designing MOSFET shunt switches for use in CMOS switched capacitor circuits powered by a low voltage power supply.

SUMMARY OF THE INVENTION

The present invention generally comprises a low voltage circuit design approach in which a transient voltage pulse multiplier is used to increase the voltage of control signal pulses to key MOSFET switching transistors, enabling them to be sized small enough to have reduced parasitic charge injection and capacitive feedthrough. The present invention is particularly well-suited to a variety of low voltage op-amp circuit having one or more shunt switches, such as switched capacitor op-amp circuits.

The present invention generally comprises a compact, CMOS integrated circuit, having: a DC power supply voltage terminal; a ground terminal; a pulsed signal input node; an integrated capacitor; a MOSFET charging switch, the MOSFET charging switch coupling the capacitor to the DC power supply voltage terminal; a pulsed signal output node; a control circuit to adjust the operation of the MOSFET charging switch so that the capacitor is charged in the absence of a signal at the pulse signal input node whereas the voltage of the capacitor is added in series to the voltage at the power supply terminal in response to input signal pulses at the pulsed signal input to produce voltage multiplied pulses at the pulsed signal output node having an amplitude substantially greater than the power supply voltage; a circuit element with two shunt terminals for electrically coupling two circuit nodes of said circuit element, the circuit element having power supply connections to the DC power supply voltage terminal and said ground terminal; a n-channel MOSFET transistor shunt switch with source and drain terminals coupled to the shunt terminals of the circuit element and a gate terminal coupled to the pulsed signal output node; wherein the gate width of the n-channel MOSFET transistor shunt switch is selected to couple the circuit nodes with a voltage drop of less than ten percent and said MOSFET transistor shunt switch is sized to reduce parasitic charge injection and capacitive feedthrough of the shunt switch.

BRIEF DESCRIPTION OF THE DRAWINGS

FIG. 1A is a prior art circuit schematic of a transmission gate switch for regulating operation of another electronic circuit element.

FIG. 1B is a prior art diagram showing how the on-resistance of the n-channel and p-channel MOSFETs of the transmission gate of FIG. 1 varies with input signal voltage.

FIG. 2 is a prior art figure showing a switched capacitor element, its equivalent resistance, and a conventional circuit for generating non-overlapping clock signals to drive the switches.

FIG. 3 is an illustrative schematic circuit block diagram showing a first embodiment of the present invention in which the control signals applied to the gates of shunt transistor switches are increased by voltage multiplier.

FIG. 4 is an circuit schematic of a preferred transient voltage pulse multiplication circuit that performs the function of converting input signal pulses into output pulses that have an output increased to an amplitude greater than the power supply voltage.

FIG. 5 is a circuit schematic of an switched capacitor op-amp circuit.

FIG. 6 is a circuit schematic of a preferred driver for the op-amp circuit of FIG. 5 comprising two transient voltage pulse multipliers similar to that of FIG. 4.

FIG. 7 is a circuit schematic of a preferred high frequency switched capacitor filter.

FIG. 8 is a clock drive circuit for FIG. 7.

DETAILED DESCRIPTION OF THE INVENTION

The present invention is generally directed towards a low voltage CMOS circuit with a compact integrated transient voltage pulse multiplier to increase the voltage of control signals to the gates of a select number of key MOSFET control switches, thereby permitting the switches to be scaled to a size for which deleterious charge injection and capacitive feedthrough is reduced. More particularly, the present invention is addressed to a high performance low voltage switched capacitor op-amp circuit in which the controls switches are part of switched capacitor elements regulating the effective resistance along a plurality of circuit branches.

FIG. 3 shows a first embodiment of the present invention. A circuit element 305 may comprise a variety of low-voltage circuits requiring one or more control switches 310. As indicated by capacitor 380, shown in phantom, circuit element 305 may include a switched capacitor element comprising capacitor 380 and one or more switches $S_1$, $S_2$ although the present invention may also be beneficially used for other applications as well. Circuit element 305 is preferably an op-amp circuit including at least one op-amp, although there it may also comprise other circuit elements, such as low voltage comparators.

As indicated in FIG. 3, there are preferably a total of N control switches $S_1 \ldots S_N$, where N is an integer greater than or equal to one, which are used to adjust the function of circuit element 305. Each control switch 310-i is preferably an n-channel MOSFET with source and drain terminals coupled to input and output terminals 320-i, 330-i of circuit element 305. The gates of the control switches 310 are driven by control pulses $mPH_1$, or its complementary non-overlapping signal $mPH_2$.

Switch control signals $mPH_1$, $mPH_2$ comprise the voltage multiplied outputs of non-overlapping control signals $PH_1$, $PH_2$, where m in a multiplicative scale factor. A voltage pulse multiplier 360 is used to multiply the voltage of control signals produced by switch control signal generator 350. Switch control signal generator 350 may comprise an oscillator (or, as shown, receive an oscillator signal) to produce a conventional clock signal, $PH_1$, and its non-overlapping complement, $PH_2$. However, switch control signal generator 350 may also perform a more complex function. As indicated by dashed arrow 370, the switch control signal generator 350 may also receive input signals corresponding to the status of circuit element 305 so that switch control signal generator 350 performs a more complex control function. As one example, input signal 370 may be a signal that enables switch control signal generator 350 as a function of the operational state of circuit element 305. As another example, input signal 370 may be a control signal that adjusts the pulse width of clock signals $PH_1$, $PH_2$ produced by switch control signal generator 350 (i.e., pulse-width modulation).

As indicated in FIG. 3, circuit element 305 and switch control signal generator 350 are both powered by a low voltage power supply, $V_{BB}$. Voltage pulse multiplier 360 preferably increases the voltage of control signals $PH_1$, $PH_2$ by a multiplicative factor, m, high enough so that switches $S_1 \ldots S_N$ are driven well into the ohmic region. For n-channel MOSFET switches, a control switch 310 is driven into the ohmic region if the gate-source voltage is equal to or greater than the sum of the source drain voltage plus the threshold voltage. The threshold voltage of an n-channel MOSFET depends upon the fabrication process, but is typically greater than about 0.5 volts. The source-drain voltage corresponds to the potential difference between terminals 320, 330. In a wide variety of active and passive circuits, the potential difference between terminals 320, 330 will be less than or equal to the voltage of the low voltage power supply, $V_{BB}$. Thus, to ensure that control switch 310 is driven into the ohmic region over a wide variety of potential operating conditions, it is desirable that the voltage multiplied switch control signals $mPH_1$, $mPH_2$, have a voltage that is greater than the supply voltage by at least about 0.5 volts. Moreover, since the current conducted by a MOSFET increases rapidly in the ohmic region, it is desirable that the voltage of the switch control signals be further increased by several hundred millivolts. For a power supply voltage of less than about 1.5 volts, this implies that the voltage is preferably almost doubled by voltage pulse multiplier 360.

While the embodiment of FIG. 3 provides a benefit over a wide range o power supply voltages, $V_{BB}$, it is particularly beneficial for a power supply voltage corresponding to a single miniature battery. With a power supply voltage that is nominally 1.5 volts, driving the control switches 310-i of circuit element 305 well into the ohmic region with a voltage pulse multiplier 360 permits almost a two-order of magnitude reduction in the gate width of shunt switches 310-i compared with the shunt switch 110 of FIG. 1 in order to achieve a comparable on-resistance. This reduces the capacitive feedthrough and parasitic charge injection of shunt switch 310 by a corresponding factor. Consequently, each control switch 310 has a dramatically improved turn-off response compared with shunt switch 110 of FIG. 1. If circuit element 305 comprises low voltage op-amp or comparator circuits, the reduction in parasitic turn-off effects permits a variety of low-distortion analog circuits to be implemented that would not otherwise be practical.

In the context of miniature hearing aids designed to fit in the ear canal, space is at a severe premium. Thus, voltage pulse multiplier 360 is preferably implemented as a compact integrated circuit requiring no additional discrete components. Also, since the total energy stored in a miniature hearing aid battery is limited, voltage pulse multiplier 360 should preferably required very little power. While a voltage pulse multiplier 360 could be implemented using conventional DC voltage multipliers to create voltage multiplied pulses, conventional DC voltage multipliers typically utilize a plurality of discrete capacitors. Consequently, the total circuit size would be unacceptably large (i.e., require too many discrete components) to be implemented as a compact hearing aid circuit. Moreover, conventional voltage multipliers often consume, by hearing aid standards, large amounts of power, reducing battery lifetime.

The inventor has recognized that a compact, low power, integrated voltage pulse multiplier 360 is required for hearing aid applications. According to the teachings of the present invention a modified charge pump circuit is preferably used to provide direct voltage multiplication of pulse control signals in what the inventor describes as transient voltage pulse multiplication. In transient voltage pulse multiplication, an input signal (i.e., PH1) is used to trigger the charging/discharging of a modified charge pump circuit to form voltage multiplied output pulses. When the modified charge pump circuit in a charging state, a capacitor is charged to the power supply potential and the output is low. However, when the modified charge pump circuit is triggered by an input signal, the charged capacitor is coupled in series to the power supply voltage to produce voltage multiplied output pulses.

FIG. 4 shows a circuit schematic of a preferred transient voltage pulse multiplication circuit 400 which utilizes a capacitor 460, two inverters 410, 420 and a p-channel MOSFET 430. One terminal of capacitor 460 is coupled to the power supply voltage terminal 462 by MOSFET charging switch 430. The inverters 410, 420 form a control circuit that adjusts the operation of the MOSFET charging switch 430 so that capacitor 460 is charged up to the supply voltage during a high signal at input node 464 whereas the voltage of capacitor 460 is added in series to the voltage at the power supply terminal 462 in response to a low input signal. When a high input signal is received at the input terminal 464, inverter 420 produces a low output 466, turning on p-channel MOSFET charging switch 430 so that capacitor 460 charges to the supply voltage.

When a low input signal is received, inverters 410, 420 produce a high output (e.g., they couple a high signal from the power supply). P-channel MOSFET charging switch 430 is turned off when inverter 420 produces a high signal. The voltage at node A6 is the voltage on capacitor 460 in series with the supply voltage coupled by inverter 410. This results in an output pulse from inverter 420 coupled to output 466 that is approximately twice the supply voltage.

While a voltage doubler is preferred, a voltage tripler may also be used. U.S. patent application Ser. No. 09/149,927 now U.S. Pat. No. 6,157,252 which is assigned to the assignee of the present invention, the teachings of which are hereby incorporated by reference, discloses a transient voltage pulse multiplier configured as a multi-stage voltage tripler to approximately triple the voltage of pulse-width modulated signals in Class-D power amplifiers.

The transient voltage pulse multiplication circuit 400 of FIG. 4 utilizes a small number of compact elements to achieve the function of increasing the voltage of control signal pulses. It is extremely compact in terms of chip area. Unlike many conventional DC voltage multipliers, it does not require additional discrete capacitors. The size of capacitor 460 depends upon the load that it must drive. Transient voltage pulse multiplication circuit 400 is preferably used to drive the gates of a comparatively small number of MOSFET switches 310 so that the total drive current that it must provide is low. Generally, capacitor 460 preferably has a total capacitance greater than the total gate capacitance of the switches 310 which it must drive so that it has sufficient charge to rapidly increase the gate voltage. For the situation in which the transient voltage pulse multiplication circuit 400 is used to drive the gates of a small number of switches 310 each of which has a compact gate area (e.g., each a gate width less than about six microns and a gate length less than about four microns), capacitor 460 may have a minimum value less than a few picofarads. Consequently, transient voltage pulse multiplier 400 may be implemented as a compact, inexpensive integrated circuit requiring no additional discrete capacitors for its implementation.

The control switch 310 parameters corresponding to a compact transient voltage multiplier 400 are also consistent with a low noise, low distortion circuit element 305. As previously discussed, parasitic charge injection during turn-off of switches 310 is reduced by selecting a small gate area of switched 310. For a variety of analog circuits, the gate length of key switching transistors 310 may be reduced to at least as low as two microns to reduce parasitic charge injection. Further reductions in gate length continue to reduce parasitic charge injection, although some analog circuits suffer from other noise mechanisms when the gate length of a MOSFET is made smaller than about two microns. Since the transistor switches are driven into the ohmic region in the present invention, the gate width of the MOSFET switches may be beneficially reduced to at least as low as three microns while maintaining an on-resistance of switches 310 less than several kilo-ohms.

FIG. 5 is a circuit schematic of a preferred embodiment of a switched capacitor op-amp circuit 500 of the present invention using the preferred transient voltage pulse multiplier 400. As can be seen in FIG. 5 only n-channel MOSFET switches are used. The switched capacitor op-amp circuit 500 comprises a low voltage op-amp 510 with a first switched capacitor 520 forming a first equivalent resistance to inverting terminal 505 of op-amp 510 and a second switched capacitor 530 forming a second equivalent resistance utilized as a feedback element coupling the output of op-amp 510 to the inverting terminal 505. Switched capacitor 520 comprises a capacitor 540 and n-channel MOSFET switches 545, 550. Switched capacitor 530 comprises capacitor 560 and n-channel MOSFET switches 560, 570, 575. The n-channel switches 545, 550, 565, 570, 575 are configured to be driven by both normal and non-overlapping complementary clock signals to reduce the effect of deleterious charge injection. In a preferred embodiment, n-channel switches 545, 550, 565, 570, 575 are sized to achieve a reasonable on-resistance while also reducing parasitic charge injection and capacitive feedthrough. The use of voltage multiplied clock signals permits the use of n-channel transistors with a gate width less than ten microns. In a preferred embodiment, each n-channel MOSFET switch has a gate width of five microns or less and a gate length of two microns in order to reduce capacitive feedthrough and parasitic charge injection.

FIG. 6 shows a preferred circuit to implement a voltage multiplication function for gate signals PH1 and PH2 of n-channel switches 545, 550, 565, 570, 575. As shown in FIG. 6, oscillator clock pulses 580 are input to non-overlapping phase splitter 5885 which performs a function similar to that shown in FIG. 3(d). The oscillator 580 may be any conventional low voltage oscillator or clock with a suitably rapid oscillation rate to achieve the desired equivalent resistance of switched capacitors 520, 530. The normal and complementary oscillator signals are each sent to a separate transient voltage pulse multiplication circuit 400 to produce voltage doubled gate control signals PH1 and PH2. The capacitor of each transient voltage pulse multiplication circuit 400 is preferably scaled to provide sufficient charge to drive the gates of its corresponding n-channel MOSFET switches in a time period that is small compared to a clock period.

The approach of the present invention may be extended to include a variety of switched capacitor circuit with a plurality of switches, capacitors, and op-amps. FIG. 7 is a circuit schematic of an embodiment of a high pass filter 700 comprising a plurality of switches and capacitors configured to achieve a high pass filter function. The gate width of the n-channel transistors is preferably about five microns whereas the corresponding gate width is preferably about two microns. As indicated in FIG. 7 there are four n-channel switches operating off of control signal PH1 and four n-channel switches operating off of control signal PH2. FIG. 8 shows a corresponding circuit to generate the normal and non-overlapping complementary oscillator signals utilizing two transient voltage pulse multiplication circuit 400 to produce voltage doubled gate control signals mPH1 and mPH2. The two capacitors 460 preferably each have a value of 0.5 picofarads.

The high pass filter of FIG. 8 is operable at a power supply voltage of less than 1.5 volts. Noise and distortion are within acceptable tolerance for state-of-the-art hearing aids. Since no discrete components are required for the implementation of the high-pass filter of FIG. 8, it may be integrated with other hearing aid components as part of a miniature hearing aid.

While low voltage circuits with a battery voltage of less than about 1.5 volts are one intended use for the present invention, it will be understood that the art of low voltage circuit design includes a variety of circuits with a supply voltage of less than about three volts. It will thus be understood that the present invention provides a benefit at a variety of other supply voltages, although the largest benefits will occur for supply voltages of about two volts or less.

In summary, the present invention comprises the use of an integrated transient voltage pulse multiplier to increase the gate voltage of control signals to control switches in a low voltage circuit, such as an op-amp circuit. The gate width of control switches may be reduced while achieving an acceptable on-resistance, thereby reducing parasitic charge injection and capacitive feedthrough. The integrated transient voltage multiplier may be implemented as a compact integrated circuit requiring only a single capacitor with a value less than a picofarad.

Although a preferred embodiment of the present invention and modifications thereof have been described in detail herein, it is to be understood that this invention is not limited to those precise embodiments and modifications, and that other modifications and variations may be affected by one of ordinary skill in the art without departing from the spirit and scope of the invention as defined in the appended claims.

What is claimed is:

1. A switched capacitor operational amplifier circuit for operation with a low voltage power supply of less than three volts for amplifying an input signal, comprising:

an operational amplifier having two input terminals and an output terminal;

at least two MOSFET switches coupled to said low voltage power supply;

a first capacitor coupled between a first said input terminal and said input signal by said at least two MOSFET switches to form a switched capacitor input of said operational amplifier circuit;

a second capacitor coupled between said output terminal and said first input terminal;

clock circuit means for providing non overlapping clock pulses;

pulse multiplier means coupled to said clock circuit means for providing multiplied clock pulses having an amplitude substantially greater than said supply voltage for driving said MOSFET switches selectively into their on states.

* * * * *